United States Patent [19]

Stinton et al.

[11] Patent Number: 4,598,024

[45] Date of Patent: Jul. 1, 1986

[54] DISPERSION TOUGHENED CERAMIC COMPOSITES AND METHOD FOR MAKING SAME

[75] Inventors: David P. Stinton, Knoxville; Walter J. Lackey; Robert J. Lauf, both of Oak Ridge, all of Tenn.

[73] Assignee: The United States of America as represented by the United States Department of Energy, Washington, D.C.

[21] Appl. No.: 655,488

[22] Filed: Sep. 28, 1984

[51] Int. Cl.$^4$ ................................................. B32B 9/04
[52] U.S. Cl. ..................................... 428/448; 427/249; 427/255; 427/255.1; 428/450; 428/698
[58] Field of Search ............... 428/426, 428, 432, 446, 428/448, 450, 698; 427/249, 255, 255.1; 264/81

[56] References Cited

U.S. PATENT DOCUMENTS 4,039,997  8/1977  Huang et al. .................. 428/426 X Primary Examiner—Theodore E. Pertilla
Attorney, Agent, or Firm—Earl L. Larcher; Stephen D. Hamel; Judson R. Hightower

[57] ABSTRACT

Ceramic composites exhibiting increased fracture toughness are produced by the simultaneous codeposition of silicon carbide and titanium disilicide by chemical vapor deposition. A mixture of hydrogen, methyltrichlorosilane and titanium tetrachloride is introduced into a furnace containing a substrate such as graphite or silicon carbide. The thermal decomposition of the methyltrichlorosilane provides a silicon carbide matrix phase and the decomposition of the titanium tetrachloride provides a uniformly dispersed second phase of the intermetallic titanium disilicide within the matrix phase. The fracture toughness of the ceramic composite is in the range of about 6.5 to 7.0 MPa$\sqrt{}$m which represents a significant increase over that of silicon carbide.

7 Claims, No Drawings

DISPERSION TOUGHENED CERAMIC COMPOSITES AND METHOD FOR MAKING SAME

This invention was made as the result of work under Contract W-7405-ENG-26 between Union Carbide Corporation, Nuclear Division, and the United States Department of Energy.

BACKGROUND OF THE INVENTION

This invention relates generally to dispersion toughened ceramic composites having increased resistance to fracture, and more particularly to the preparation of such composites by the codeposition of thermal decomposition products which form a matrix of silicon carbide with a dispersed phase of titanium disilicide.

Ceramics are becoming of increasing importance as construction materials for components such as gas turbine blades, pump impellers and the like which are exposed to high temperature environments and/or abrasive or corrosive conditions. Often ceramic materials are toughened to increase resistance to fracture by the addition of a dispersed second phase or fibers such as with the ceramic composites of $Al_2O_3$—$ZrO_2$, $Si_3N_4$—SiC, $Al_2O_3$—TiC, fiber reinforced silicon carbide, and partially stabilized $ZrO_2$. The second phase, or dispersed phase, in dispersion toughened ceramic composites is usually provided by the addition of small particles which are randomly dispersed throughout the ceramic matrix. An increase in the toughness of these dispersion hardened ceramic composites occurs when a metastable second phase in the ceramic matrix absorbs energy from the stress field of an advancing crack and transforms this energy to a stable phase in the ceramic as in the case of partially stabilized zirconia. Also, mechanical toughness of the ceramic can be increased when a stable dispersed phase absorbs energy from a stress field causing plastic deformation or crack diversion and branching by the second phase.

The preferred microstructure of a dispersion toughened ceramic composite is provided by dispersing particulates throughout the ceramic matrix. However, such microstructures are not readily provided by employing conventional powder blending and consolidation techniques, primarily due to the fact that the dispersed particles are typically somewhat larger than desired and uniform distribution throughout the matrix is seldom achieved. Also, in covalently bonded compounds such as nitrides and carbides, high densities are often difficult to achieve due to the sintering characteristics of such materials.

SUMMARY OF THE INVENTION

It is the primary aim or objective of the present invention to provide a dispersion toughened ceramic composite by employing a chemical vapor deposition process wherein the ceramic composite is deposited as a coating upon a suitable substrate. The coating comprises a matrix phase of silicon carbide with an intermetallic phase of titanium disilicide uniformly dispersed within the matrix. Generally, the method for fabricating this ceramic composite is achieved by the steps of contacting a substrate with a gaseous mixture of methyltrichlorosilane, titanium tetrachloride, and a carrier gas of hydrogen while heating the substrate and gaseous mixture to a temperature sufficient to thermally decompose the methyltrichlorosilane and titanium tetrachloride to effect the codeposition of a matrix phase of silicon carbide and a dispersed intermetallic phase of titanium disilicide. The composite coating provided by the present invention exhibits a considerable increase in toughness over that of silicon carbide due to the presence of dispersed phase of titanium disilicide uniformly dispersed throughout the matrix. Also, near theoretical densities of the toughened ceramic composites can be obtained without the use of mechanical mixing or sintering aids. The ceramic composite is tenaceously bonded to the substrate by the chemical vapor deposition process so as to provide the composite with sufficient integrity for use in structural applications exposed to high temperatures as well as corrosive and abrasive environments.

Other and further objects of the invention such as the use of molybdenum, tungsten, or niobium silicides as the dispersed phase will be obvious upon an understanding of the illustrative method and article about to be described or will be indicated in the appended claims, and various advantages not referred to herein will occur to one skilled in the art upon employment of the invention in practice.

DETAILED DESCRIPTION OF THE INVENTION

As briefly described above, ceramic composites of the present invention are prepared by the codeposition of a silicon carbide (SiC) matrix in which an intermetallic phase of titanium disilicide ($TiSi_2$) is uniformly dispersed. The matrix and the dispersed phase are codeposited in a conventional chemical vapor deposition system. In such a system, a carrier gas of hydrogen is passed through a vaporizer containing the methyltrichlorosilane ($CH_3SiCl_3$) to sweep the methyltrichlorosilane vapor toward the furnace. This stream of hydrogenmethyltrichlorosilane is, in turn, mixed with additional quantity of hydrogen carrier gas and a second composite-forming gas of titanium tetrachloride ($TiCl_4$). The combined mixture is then conveyed by the carrier gas into a furnace which is at an operating pressure of about 0.1 to slightly greater than 1.0 atmosphere and in which a suitable substrate is suspended for receiving the decomposition products resulting from the decomposition of the methyltrichlorosilane and the titanium tetrachloride. The furnace and substrate is heated to a temperature within the range of about 1200°–1500° C. for effecting the decomposition of reactant gases to effect the codeposition of the silicon carbide and titanium disilicide onto the substrate. As with the usual chemical vapor deposition systems, the off gases discharged from the furnace are scrubbed to remove reaction products.

The substrate upon which the coating of silicon carbide and titanium disilicide is deposited may be any suitable substrate such as silicon carbide, silicon nitride, titanium nitride, graphite and carbon-carbon composites.

The composition of the gaseous mixture used for providing the composite coating is formed of about 86–95% gaseous hydrogen, about 3–10% methyltrichlorosilane, and about 1–4% titanium tetrachloride. The morphology of the coating can be varied by regulating or depositing at various temperatures and by modifying the gas composition within the aforementioned ranges. For example, a ceramic composite coating deposited at a temperature of about 1300° C. is provided witn a fracture toughness of about 7.1 MPa$\sqrt{m}$; a composite coating codeposited at 1400° C. is provided with a fracture toughness of about 6.5 MPa$\sqrt{}$m. The dispersion of titanium disilicide provides about 15 to 60 wt. % of the ceramic composite.

In the selection of the constituents for forming the dispersion toughened ceramic composition of the present invention, several materials were examined by thermodynamic analysis and determined to be unacceptable. For example, chromium trifluoroacetylacetonate [Cr(tfa)$_3$], nickel trifluoroacetylacetonate [Ni(tfa)$_2$], WF$_6$, MoF$_6$, and TiCl$_4$ were investigated using silicon carbide as the matrix forming material. It was determined that the nickel- and chromium-containing organometallic compounds were not suitable as sources of nickel and chromium for forming the ceramic composite since the large quantity of carbon present in these compounds caused free carbon to be deposited in the system so as to significantly detract from the hardness desired of the material of the present invention. Further, large quantities of the carbon present in the organometallic reactant compounds caused either the presence of free carbon or, if reactant concentrations were altered to avoid free carbon, insufficient quantities of the dispersed phases Cr$_3$C$_2$ or Ni were produced to yield adequate fracture toughening in the composites. Further, the fluorides of tungsten and molybdenum were found not to be suitable since the fluorine present in these compounds reacts with the silicon so as to form stable gaseous SiF$_3$ and SiF$_4$ which inhibits the deposition of the required silicon carbide matrix.

It was expected from thermodynamic calculations of the CH$_3$SiCl$_3$—TiCl$_4$ system that the TiC would be the stable form of titanium and that free silicon would result from the loss of carbon from the silicon carbide. In such calculations, the addition of a hydrocarbon to the calculations for providing free carbon produced stable regions of silicon carbide and titanium carbide. However, and somewhat surprisingly, experimental runs made without the addition of excess hydrocarbon yielded two phases in the deposit with the first phase being a silicon carbide matrix and the second phase being the intermetallic compound titanium disilicide. Thermodynamic values for this intermetallic are not known but have been estimated for the calculations. Also, variations in experimental conditions within the calculations never produced titanium disilicide deposits. Apparently the kinetics of the reaction caused the titanium disilicide to be formed, as in a metastable phase.

Properties of the SiC—TiSi$_2$ deposit provided by the present invention provide considerable advantages over the prior art coatings. For coatings with thicknesses in the range of about 10 to 300 micrometers toughness values determined by microindentation show that the chemical vapor deposited ceramic composites had a fracture toughness in the range of about 6.5 to 7.1 MPa$\sqrt{}$m which represent a significant increase over the fracture toughness values of about 3.5 to 4 MPa$\sqrt{}$m of silicon carbide.

In order to provide a more facile understanding of the present invention, an example of a typical preparation of a ceramic composite on a silicon carbide substrate is set forth below.

EXAMPLE

A gaseous mixture of 92.8% hydrogen, 4.9% CH$_3$SiCl$_3$, and 2.3% TiCl$_4$ was introduced into a furnace containing a graphite substrate and exposed to a temperature of 1400° C. The CH$_3$SiCl$_3$ and the TiCl$_4$ thermally decompose to form a composite coating of a silicon carbide matrix phase and a uniformly dispersed phase of the intermetallic TiSi$_2$. After a period of 120 minutes, a composite coating with a thickness of 290 micrometers was provided. A fracture toughness for the coating was 7.1 MPa$\sqrt{}$m. The dispersed phase of titanium disilicide was uniformly dispersed throughout the silicon carbide matrix and the chemical vapor deposition process provided the coating with near theoretical density so as to provide the toughened ceramic composite.

It will be seen that the present invention provides an improved ceramic composite which has sufficient structural integrity where oxidation, wear and erosion resistance coatings are required especially in high temperature applications such as encountered in energy conversion systems such as gas turbines and heat engines and also as structural components subjected to fracture causing stresses.

We claim:

1. A ceramic structure comprising a ceramic substrate capable of withstanding a temperature of at least about 1,200° C. and −1,500° C. and a ceramic composite coating thereon, said coating comprising a matrix phase of silicon carbide and an intermetallic phase of titanium disilicide uniformly dispersed within said matrix.

2. The ceramic structure claimed in claim 1 wherein said coating is of a thickness in the range of about 10 to 300 micrometers and wherein the coating is characterized by a fracture toughness in the range of about 6.5 to 7.0 MPa$\sqrt{}$m.

3. The ceramic structure claimed in claim 1 wherein the dispersion of titanium disilicide provides about 15 to 60 wt. % of said coating.

4. A method for fabricating a ceramic structure provided with a ceramic composite coating thereon formed by chemical vapor deposition, comprising the steps of contacting a ceramic substrate capable of withstanding a temperature of at least about 1,200° C.–1,500° C. with the gaseous mixture of methyltrichlorosilane, titanium tetrachloride and the carrier gas of hydrogen, and heating the substrate and gaseous mixture to a temperature sufficiently to thermally decompose the methyltrichlorosilane and the titanium tetrachloride to effect the codeposition of a matrix phase of silicon carbide and a dispersed intermetallic phase of titanium disilicide.

5. The method claimed in claim 4 wherein said temperature is the range of about 1200°–1500° C.

6. The method claimed in claim 4 wherein the gaseous mixture contains about 3–10 vol. % methyltrichlorosilane, about 1–4 vol. % titanium tetrachloride and the balance hydrogen.

7. The method claimed in claim 4 wherein the codeposition is maintained for a sufficient duration to provide a coating of a thickness in the range of about 10 to 300 micrometers.

* * * * *